US008334192B2

(12) United States Patent
Lee

(10) Patent No.: US 8,334,192 B2
(45) Date of Patent: Dec. 18, 2012

(54) METHOD OF FABRICATING GALLIUM NITRIDE SUBSTRATE

(75) Inventor: Jeong Sik Lee, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 0 days.

(21) Appl. No.: 12/334,583

(22) Filed: Dec. 15, 2008

(65) Prior Publication Data

US 2009/0155987 A1 Jun. 18, 2009

(30) Foreign Application Priority Data

Dec. 18, 2007 (KR) ........................ 10-2007-0133385

(51) Int. Cl.
*H01L 21/36* (2006.01)

(52) U.S. Cl. ................... 438/478; 438/47; 257/E21.461

(58) Field of Classification Search .................... 438/47, 438/478, FOR. 134; 257/E21.461
See application file for complete search history.

(56) References Cited

U.S. PATENT DOCUMENTS

2002/0197825 A1* 12/2002 Usui et al. ..................... 438/459
2006/0046325 A1* 3/2006 Usui et al. ....................... 438/21
2009/0194848 A1* 8/2009 Uemura et al. ............... 257/615

FOREIGN PATENT DOCUMENTS

EP 1 246 233 A2 10/2002
KR 10-2001-0031819 4/2001
KR 10-2004-0078211 9/2004

OTHER PUBLICATIONS

Effects of thermal annealing on In-induced metastable defects in InGaN films H. Hung, K. T. Lam, S. J. Chang, H. Kuan, C. H. Chen, U. H. Liaw Available online: Jul. 2, 2007 Materials Science in Semiconductor Processing 10 (2007) 112-116.*

* cited by examiner

*Primary Examiner* — Hsien Ming Lee
*Assistant Examiner* — Walter H Swanson
(74) *Attorney, Agent, or Firm* — Lerner, David, Littenberg, Krumholz & Mentlik, LLP

(57) ABSTRACT

A method of fabricating a gallium nitride (GaN) substrate provides a GaN thick film without causing bending and cracks which may occur in a growing process. To this end, a nitride embedding layer having a plurality of voids therein is embedded between a GaN layer and a base substrate. The method includes preparing a base substrate, growing, on the base substrate, the nitride embedding layer having a plurality of indium-rich parts at a first temperature, and growing a GaN layer on the nitride embedding layer at a second temperature higher than the first temperature so as to metallize the indium-rich part to form a plurality of voids in the nitride embedding layer.

12 Claims, 4 Drawing Sheets

METHOD OF FABRICATING GALLIUM NITRIDE SUBSTRATE

CROSS-REFERENCE TO RELATED APPLICATION

This application claims the benefit of Korean Patent Application No. 2007-0133385 filed on Dec. 18, 2007, in the Korean Intellectual Property Office, the disclosure of which is incorporated herein by reference.

BACKGROUND OF THE INVENTION

1. Field of the Invention

The present invention relates, in general, to a method of fabricating a gallium nitride (GaN) substrate by which a GaN thick film is obtained without bending and cracks which may occur in the growing process.

2. Description of the Related Art

Generally, GaN has band gap energy of 3.39 eV and is a direct transition type semiconductor material, which is useful for fabricating a short-wavelength light-emitting device or the like. Since GaN single crystal has high nitrogen vapor pressure at a fusion point, it needs a processing condition of high temperature above 1500° C. and a nitrogen atmosphere of 20,000 atm to carry out liquid crystal growth. Thus, it is difficult to accomplish mass production thereof.

Until now, GaN film has been obtained on a hetero-substrate by using a vapor phase growing method, such as metal organic chemical vapor deposition (MOCVD), hydride vapor phase epitaxy (HVPE), or the like. In case of MOCVD, it can provide a high quality film but a growth rate thereof is too low, so that it is difficult to obtain a GaN substrate with a thickness of tens or hundreds micrometers. For the above reason, an HVPE growing method is mainly used to fabricate a GaN thick film.

As a hetero-substrate for fabricating a GaN film, a sapphire substrate is most widely used. This is because sapphire has the same hexagonal system as GaN, is cheap, and is stable at high temperature. However, strain is caused to a boundary due to differences of the lattice constant (about 13%) and thermal expansion coefficient (about 35%) between sapphire and GaN, generating defects and cracks in a crystal. This makes it difficult to grow a high quality GaN film and shortens the lifetime of a device fabricated on the GaN film.

When GaN is grown on a sapphire substrate, as illustrated in FIG. 1, bending occurs in the direction from the sapphire substrate 100 to a GaN layer 210 due to a difference in the thermal expansion coefficient between the sapphire substrate and the GaN layer. Meanwhile, in the cooling process after the growth of the GaN layer, as illustrated in FIG. 2, bending occurs in the counter direction and stress is applied all over the GaN layer. Even after the GaN layer is separated from the sapphire substrate, the durability of a GaN freestanding layer remains weak.

In order to prevent such bending, there has been proposed a method in which a GaAs substrate is used. GaAs has a thermal expansion coefficient less different from that of GaN than sapphire. However, GaAs is expensive and is weak with heat.

Alternatively, there has been proposed another method for preventing bending, in which a mask is formed (by sputtering, performing P-CVD, mask patterning, etching, etc.) between a base substrate and a GaN layer, or an oxide embedding layer is embedded therebetween. However, in these cases, since separate processes are needed, a fabricating process thereof becomes complicated, and thereby the fabricating cost and time increase.

Therefore, in order to fabricate a large-area GaN substrate at a high yield rate, it needs technology of reducing stress which is transferred from the base substrate to the GaN layer.

SUMMARY OF THE INVENTION

The present invention has been made keeping in mind the above problems with the related art. The present invention is intended to propose a method of fabricating a gallium nitride (GaN) substrate which is suitable to fabricate a large-area GaN substrate, and to mitigate stress occurring between a base substrate and a GaN thick film to reduce the occurrence of bending and cracks.

The present invention is also intended to propose a method of fabricating a gallium nitride (GaN) substrate which does not need a mask patterning process or the like, thereby simplifying the fabricating process and reducing the manufacturing cost and time.

In order to achieve the above objects, the present invention proposes a method of fabricating a gallium nitride (GaN) substrate by which a GaN thick film is obtained without bending and cracks which may occur in the growing process. To this end, the present invention is characterized in that a nitride embedding layer having a plurality of voids is disposed between a GaN layer and a base substrate.

The present invention provides a method of fabricating a gallium nitride (GaN) substrate comprising a first step of preparing a base substrate, a second step of growing a nitride embedding layer on the base substrate at a first temperature, the nitride embedding layer having a plurality of indium-rich parts, a third step of growing a GaN layer on the nitride embedding layer, and a void forming step of applying a second temperature higher than the first temperature to the nitride embedding layer so that the indium-rich part is metallized to form a plurality of voids in the nitride embedding layer, wherein the first step, the second step and the third step are carried out in the order named, and the void forming step is carried out after the second step.

In accordance with an embodiment of the present invention, there is provided a method of fabricating a gallium nitride (GaN) substrate including: preparing a base substrate; growing, on the base substrate, a nitride embedding layer having a plurality of indium-rich parts at a first temperature; and growing a GaN layer on the nitride embedding layer at a second temperature higher than the first temperature so as to metallize the indium-rich part to form a plurality of voids in the nitride embedding layer.

In accordance with another embodiment of the present invention, there is provided a method of fabricating a gallium nitride (GaN) substrate including: preparing a base substrate; growing, on the base substrate, a nitride embedding layer having a plurality of indium-rich parts at a first temperature; metallizing the indium-rich part at a second temperature higher than the first temperature to form a plurality of voids in the nitride embedding layer; and growing a GaN layer on the nitride embedding layer.

In accordance with another embodiment of the present invention, there is provided a method of fabricating a gallium nitride (GaN) substrate including: preparing a base substrate; alternately and repetitively growing, on the base substrate, a nitride embedding layer and a GaN embedding layer at a first temperature to form the nitride embedding layers having a plurality of indium-rich parts; and growing a GaN layer on the nitride embedding layers at a second temperature higher than the first temperature to metallize the indium-rich parts to form a plurality of voids in the nitride embedding layers.

In accordance with another embodiment of the present invention, the nitride embedding layers are multi-layered in such a manner that at least one GaN embedding layer is interposed between the nitride embedding layers and the at least one GaN embedding layer is grown at the first temperature. Here, growing all the nitride embedding layers can precede applying the second temperature to all the nitride embedding layers at the same time so that all the nitride embedding layers undergo the void forming step at the same time.

At least one of the plurality of indium-rich parts formed in at least one of the nitride embedding layers can combine with at least one of the plurality of indium-rich parts formed in another of the nitride embedding layers to form at least one larger void.

The GaN embedding layer can be grown at the second temperature so that each of the nitride embedding layers independently undergoes the void forming step.

According to the present invention, the embedding layer which can provide the plurality of voids is disposed between the GaN layer and the base substrate to mitigate stress caused between the GaN layer and the base substrate. Thereby, it is possible to reduce the occurrence of bending, and thus advantageously fabricate the high quality GaN substrate without cracks.

Further, since a nitride-based material similar to a GaN thick film is used as the embedding layer, a growing process of the nitride embedding layer can be carried out in a growing reactor in an in-situ manner to simplify the fabricating process, thereby advantageously reducing the fabricating cost and time.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Description will now be made in greater detail of a method of fabricating a gallium nitride (GaN) substrate according to exemplary embodiments of the invention with reference to the accompanying drawings.

Figure 1:
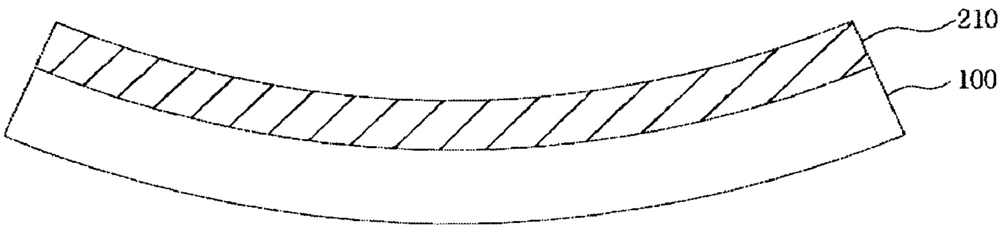
FIGS. 1 and 2 are schematic views illustrating the bending of a GaN layer occurring in a growing process and a cooling process, respectively.
Figure 2:
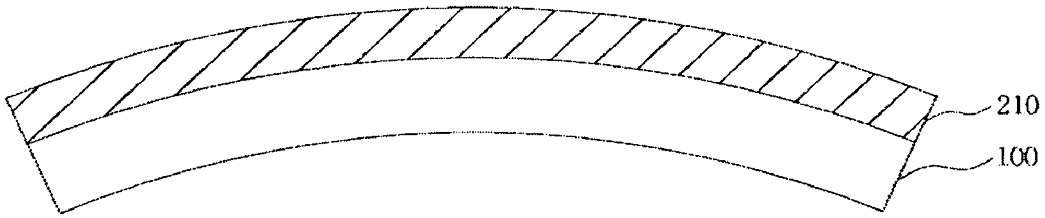
Figure 3A:
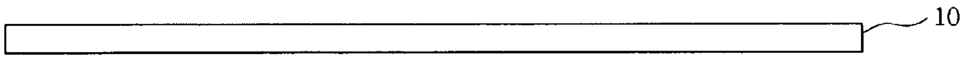
FIGS. 3A to 3C are process views illustrating a method of fabricating a GaN substrate according to a first embodiment of the present invention.
Figure 3B:
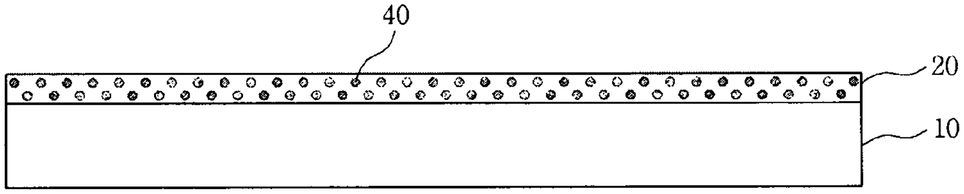
Figure 3C:
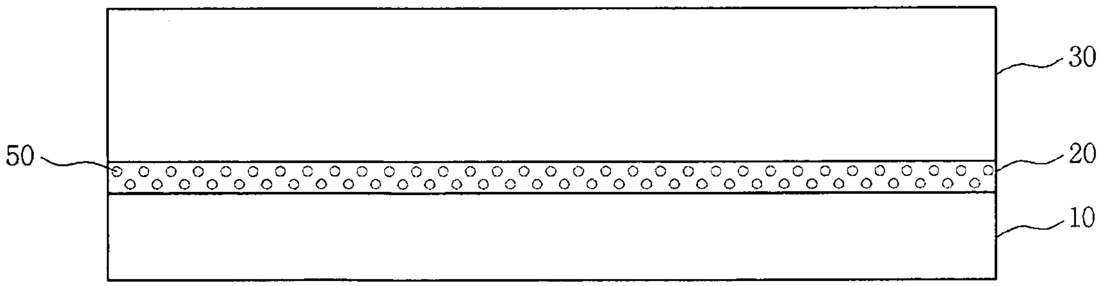

FIGS. 3A to 3C are process views illustrating a method of fabricating a GaN substrate according to a first embodiment of the present invention.

Referring to FIG. 3A, a base substrate 10 for GaN growth is prepared first.

The base substrate 10 is arranged in a growing reactor.

The base substrate 10 can be made of a material having similar crystal structure and lattice constant to those of GaN. According to the crystal structure of the base substrate, the crystal structure of the GaN layer to be grown on the base substrate can be controlled to be polar or nonpolar. The crystal structure of the GaN layer can be classified into a polar structure and a nonpolar structure. The polar structure includes only one kind of element, i.e. either Ga or N, on each plane along a c-axis. Meanwhile, the nonpolar structure includes Ga and N elements of the same number on a plane and is in an electrically-neutral state as a whole. It is known that the nonpolar structure is advantageous in view of an operational characteristic of a light-emitting device or the like. As a base substrate which can be used to grow the GaN layer to have the polar structure, there are c-plane sapphire, $SrTiO_3$, $ScAlMgO_4$, $LiNbO_3$ and the like. Meanwhile, in order to grow the GaN layer to have the nonpolar structure, a-plane or m-plane sapphire, $LiAlO_2$, $LiGaO_2$, etc. can be used as a base substrate.

Then, as illustrated in FIG. 3B, a nitride embedding layer 20 is grown on the base substrate 10. The nitride embedding layer 20 may have a composition of $Al_xGa_{1-y}In_yN$ ($0 \leqq x \leqq 1-y$, $0<y \leqq 1$). The nitride embedding layer 20 may be comprised of a nitride-based semiconductor material containing indium.

Since the nitride embedding layer 20 is the nitride-based semiconductor material like a gallium nitride (GaN) thick film 30 which is grown in the following process, two layers can be formed in the same reactor in an in-situ manner, which enables the process time and the fabricating cost to be reduced.

A first temperature at which the nitride embedding layer 20 is grown should be lower than a second temperature at which the GaN layer is grown in the following process. Preferably, the first temperature is lower than the second temperature by 100° C. or more. The first temperature has a range between 500° C. and 950° C., and preferably, is about 850° C.

Preferably, the first temperature should be lower than a critical metallization temperature, below which metallization of indium can not occur, and the second temperature should be equal to or higher than the critical metallization temperature, above which metallization of indium can occur.

When the nitride embedding layer 20 is grown on the base substrate 10 under the first temperature, as illustrated in FIG. 3B, a plurality of indium-rich parts 40 which are rich in indium is formed in the nitride embedding layer 20. Here, the indium-rich parts 40 are not uniformly distributed in the nitride embedding layer 20, and have diverse sizes.

Further, as illustrated in FIG. 3C, the GaN layer 30 is grown on the nitride embedding layer 20. Here, the second temperature at which the GaN layer 30 is grown is about 1000° C., which is higher than the first temperature by 100° C. or more. At this time, as illustrated in FIG. 3C, indium contained in the indium-rich parts 40 is metallized by high temperature, thereby forming a plurality of voids.

That is, when the nitride embedding layer 20 is grown at a lower temperature, the indium-rich parts 40 are formed in the nitride embedding layer 20. When the temperature is elevated by 100° C. or more, metallization occurs so that indium elements are combined together to form indium metal, thereby forming voids 50.

By virtue of Plural voids 50 formed in the nitride embedding layer 20, it is possible to mitigate stress applied between the GaN layer 30 and the base substrate 10 to reduce bending, and consequently provide high quality GaN substrate without cracks.

The growing process of the nitride embedding layer 20 and the GaN layer 30 can be carried out by hydride vapor phase epitaxy (HVPE), metal organic chemical vapor deposition (MOCVD), or molecular beam epitaxy (MBE).

Figure 4A:
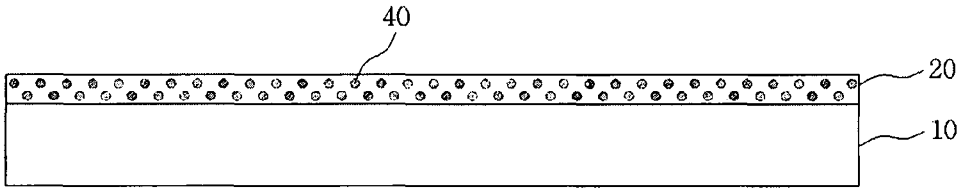
FIGS. 4A to 4C are process views illustrating a method of fabricating a GaN substrate according to a second embodiment of the present invention.
Figure 4B:
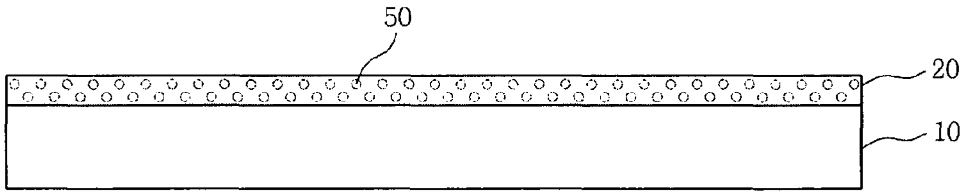
Figure 4C:
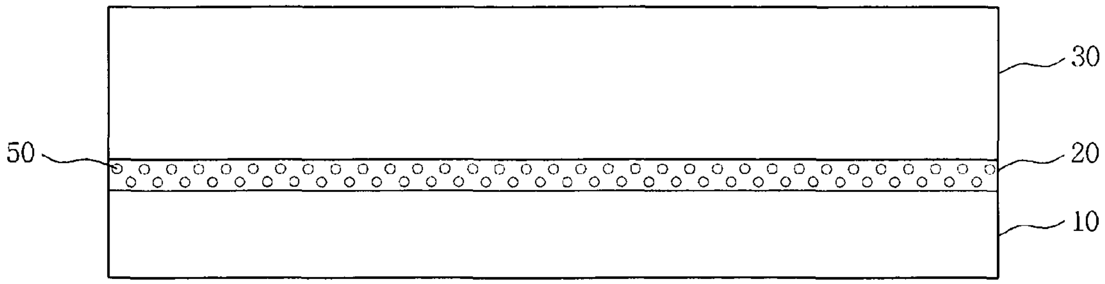

FIGS. 4A to 4C are process views illustrating a method of fabricating a GaN substrate according to a second embodiment of the present invention.

First, as illustrated in FIG. 4A, a nitride embedding layer 20 is grown on a base substrate 10 which is arranged in a growing reactor for HVPE, MOCVD or MBE process.

The nitride embedding layer 20 can have a composition of $Al_xGa_{1-y}In_yN$ ($0 \leqq x \leqq 1-y$, $0<y \leqq 1$), and can be made of a nitride-based semiconductor material like a gallium nitride thick film which is grown in the following process. Accordingly, the growing process can be carried out in the same growing reactor in an in-situ manner.

When the nitride embedding layer 20 is grown at a first temperature, a plurality of indium-rich parts 40 is formed in the nitride embedding layer 20. The first temperature has a range between 500° C. and 950° C., and preferably, is about 850° C.

After the nitride embedding layer 20 is completely grown, as illustrated in FIG. 4B, the temperature is elevated to a second temperature that is higher than the first temperature by 100° C. or more. Indium elements in the indium-rich parts 40 are metalized by the higher temperature, thereby forming the voids 50.

Then, as illustrated in FIG. 4C, the GaN layer 30 is grown on the nitride embedding layer 20.

Similarly to the first embodiment, plural voids 50 are also formed in the nitride embedding layer 20, which mitigates stress applied between the GaN layer 30 and the base substrate 10 to reduce bending, and consequently provides high quality GaN substrate without cracks.

Figure 5A:
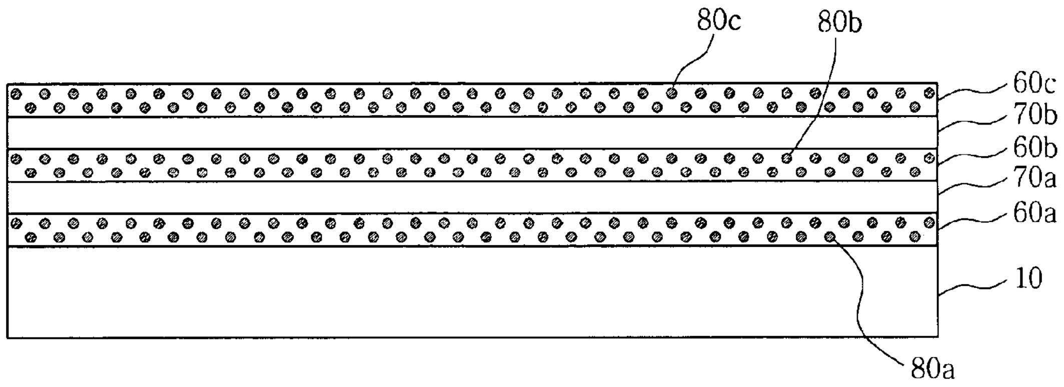
FIGS. 5A and 5B are process views illustrating a method of fabricating a GaN substrate according to a third embodiment of the present invention.
Figure 5B:
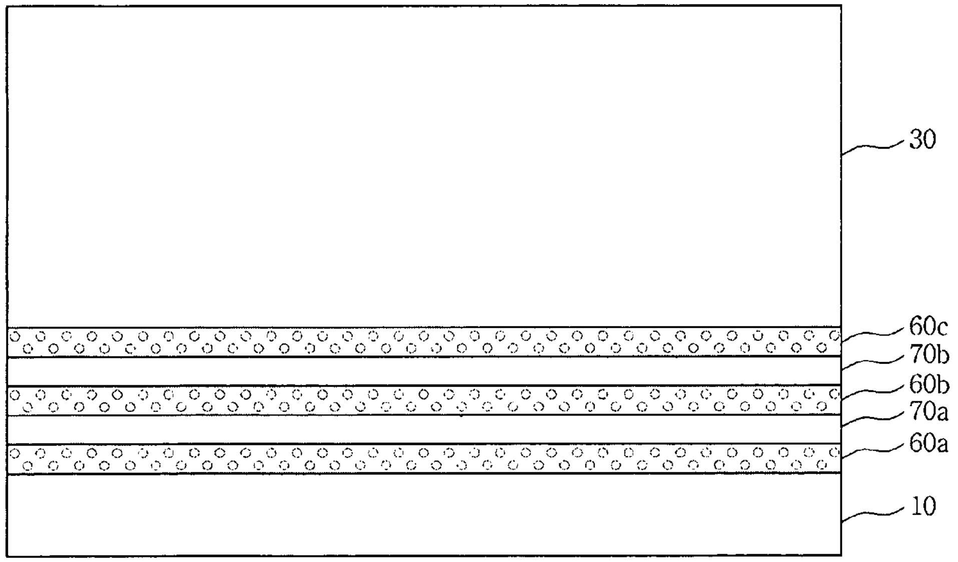

FIGS. 5A and 5B are process views illustrating a method of fabricating a GaN substrate according to a third embodiment of the present invention.

First, as illustrated in FIG. 5A, a first nitride embedding layer 60*a* is grown to a certain thickness on a base substrate 10, which is arranged in a growing reactor, at a first temperature. Thereby, a plurality of indium-rich parts 80*a* is formed in the first nitride embedding layer 60*a*.

Then, a first GaN embedding layer 70*a* is grown to a certain thickness on the first nitride embedding layer 60*a* at the first temperature. Then, a second nitride embedding layer 60*b* is formed on the first GaN embedding layer. Next, a second GaN embedding layer 70*b* is formed on the second nitride embedding layer 60*b*.

Like this, the nitride embedding layers 60*a*, 60*b*, and 60*c* and the GaN embedding layers 70*a* and 70*b* are alternately and repetitively formed to thereby form a multi-layer structure including the nitride embedding layers 60*a*, 60*b*, and 60*c*.

Here, since the nitride embedding layers 60*a*, 60*b*, and 60*c* and the GaN embedding layers 70*a* and 70*b* all are grown at the first temperature, the indium-rich parts 80*a*, 80*b*, and 80*c* still remain in the nitride embedding layers 60*a*, 60*b*, and 60*c*.

After the multi-layer structure is completely grown, as illustrated in FIG. 5B, the GaN layer 30 is grown on the multi-layer structure at a second temperature.

Here, since the second temperature is higher than the first temperature by 100° C. or more, the indium elements in the indium-rich parts 80*a*, 80*b*, and 80*c* formed in the nitride embedding layer 60*a*, 60*b*, and 60*c* are metallized by high temperature, thereby forming the plurality of voids.

Here, as temperature rises, indium elements in the indium-rich parts 80*a*, 80*b*, and 80*c* formed in different nitride embedding layers are more easily combined together across the GaN embedding layers to thereby form much larger voids.

Thus, the size of the voids can be regulated according to the number of the nitride embedding layers, so that the degree of bending of the GaN layer can be regulated.

Alternatively, the multi-layer structure may be formed in the following manner. After the first nitride embedding layer 60*a* is grown at the first temperature, the first GaN embedding layer 70*a* is grown to a certain thickness on the first nitride embedding layer 60*a* at the second temperature higher than the first temperature. Indium elements in the indium-rich parts 80*a* formed in the first nitride embedding layer 60*a* are metallized by high temperature, thereby forming the plurality of voids.

Further, the second nitride embedding layer is grown at the first temperature, and then the second GaN embedding layer 70*b* is formed on the second nitride embedding layer at the second temperature. A plurality of second voids is formed in the second nitride embedding layer 60*b*.

Like this, the nitride embedding layers 60*a*, 60*b*, and 60*c* and the GaN embedding layers 70*a* and 70*b* are sequentially and repetitively formed, and the plurality of voids are formed in the nitride embedding layers 60*a*, 60*b*, and 60*c*.

The first temperatures which are applied to the nitride embedding layers can be the same or be different from one another. Likewise, the second temperatures which are applied to the GaN embedding layers can be the same or be different from each other.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A method of fabricating a gallium nitride (GaN) substrate, the method comprising:

a first step of preparing a base substrate;

a second step of growing a nitride embedding layer on the base substrate at a first temperature, the nitride embedding layer having a plurality of indium-rich parts;

a third step of growing a GaN layer on the nitride embedding layer; and a void forming step of applying a second temperature higher than the first temperature to the nitride embedding layer so that the plurality of indium-rich parts is metalized to form a plurality of voids in the nitride embedding layer, wherein the first step, the second step and the third step are carried out in the order named, the void forming step is carried out after the second step, and the GaN layer is grown at the second temperature so that the third step and the void forming step are carried out at the same time.

2. The method according to claim 1, wherein the second step, the third step and the void forming step are carried out in a growing reactor in an in-situ manner.

3. The method according to claim 1, wherein the nitride embedding layer is comprised of $Al_xGa_{1-y}In_yN$ ($0 \leqq x \leqq 1-y$, $0<y \leqq 1$).

4. The method according to claim 1, wherein the first temperature is lower than the second temperature by 100° C. or more.

5. The method according to claim 1, wherein the first temperature ranges between 500° C. and 950° C.

6. The method according to claim 1, wherein the plurality of voids is non-uniformly distributed.

7. The method according to claim 1, wherein the plurality of voids has different sizes.

8. The method according to claim 1, wherein the nitride embedding layer is multi-layered in such a manner that at least one GaN embedding layer is interposed between the nitride embedding layers.

9. The method according to claim 8, wherein the at least one GaN embedding layer is grown at the first temperature, and growing all the nitride embedding layers precedes applying the second temperature to all the nitride embedding layers at the same time so that all the nitride embedding layers undergo the void forming step at the same time.

10. A method of fabricating a gallium nitride (GaN) substrate, the method comprising:

a first step of preparing a base substrate;

a second step of growing a nitride embedding layer on the base substrate at a first temperature, the nitride embedding layer having a plurality of indium-rich parts;

a third step of growing a GaN layer on the nitride embedding layer; and a void forming step of applying a second temperature higher than the first temperature to the nitride embedding layer so that the plurality of indium-rich parts is metalized to form a plurality of voids in the nitride embedding layer, wherein the first step, the second step and the third step are carried out in the order named, the void forming step is carried out after the second step, the nitride embedding layer is multi-layered in such a manner that at least one GaN embedding layer is interposed between the nitride embedding layers, the at least one GaN embedding layer is grown at the first temperature, the growing of all the nitride embedding layers precedes applying the second temperature to all the nitride embedding layers at the same time so that all the nitride embedding layers undergo the void forming step at the same time, and the GaN layer is grown at the second temperature so that the third step and the void forming step are carried out at the same time.

11. The method according to claim 10, wherein at least one of the plurality of indium-rich parts formed in at least one of the nitride embedding layers combines with at least one of the plurality of indium-rich parts formed in another of the nitride embedding layers to form at least one larger void.

12. A method of fabricating a gallium nitride (GaN) substrate, the method comprising:

a first step of preparing a base substrate;

a second step of growing a nitride embedding layer on the base substrate at a first temperature, the nitride embedding layer having a plurality of indium-rich parts;

a third step of growing a GaN layer on the nitride embedding layer; and a void forming step of applying a second temperature higher than the first temperature to the nitride embedding layer so that the plurality of indium-rich parts is metalized to form a plurality of voids in the nitride embedding layer, wherein the first step, the second step and the third step are carried out in the order named, the void forming step is carried out after the second step, the nitride embedding layer is multi-layered in such a manner that at least one GaN embedding layer is interposed between the nitride embedding layers, and the GaN embedding layer is grown at the second temperature so that each of the nitride embedding layers independently undergoes the void forming step.

* * * * *